United States Patent [19]

Meinders

[11] 4,234,355
[45] Nov. 18, 1980

[54] METHOD FOR MANUFACTURING A SEMICONDUCTOR ELEMENT UTILIZING THERMAL NEUTRON IRRADIATION AND ANNEALING

[75] Inventor: Horst Meinders, Reutlingen, Fed. Rep. of Germany

[73] Assignee: Robert Bosch GmbH, Stuttgart, Fed. Rep. of Germany

[21] Appl. No.: 966,039

[22] Filed: Dec. 4, 1978

[30] Foreign Application Priority Data

Dec. 13, 1977 [DE] Fed. Rep. of Germany ....... 2755418

[51] Int. Cl.² .......................................... H01L 21/263
[52] U.S. Cl. .................................. 148/1.5; 29/576 B; 29/584; 148/175; 148/187; 357/29; 357/34; 357/38; 357/39; 357/64; 357/91
[58] Field of Search .................. 148/1.5, 175; 357/29, 357/34, 38, 39, 64, 91; 29/576 B, 584

[56] References Cited

U.S. PATENT DOCUMENTS

| | | | |
|---|---|---|---|
| 3,067,485 | 12/1962 | Ciccolella et al. | 148/188 X |
| 3,532,910 | 10/1970 | Lee et al. | 357/29 X |
| 3,691,376 | 9/1972 | Bauerlein et al. | 357/29 X |
| 3,809,582 | 5/1974 | Tarneja et al. | 357/38 X |
| 3,864,174 | 2/1975 | Akiyama et al. | 148/1.5 |
| 3,880,676 | 4/1975 | Douglas et al. | 148/1.5 |
| 3,888,701 | 6/1975 | Tarneja et al. | 357/29 X |
| 3,988,172 | 10/1976 | Bachmann et al. | 148/1.5 |
| 4,056,408 | 11/1977 | Bartko et al. | 148/1.5 |
| 4,080,721 | 3/1978 | Hung | 357/91 X |
| 4,106,954 | 8/1978 | Brebisson et al. | 148/1.5 |
| 4,137,099 | 1/1979 | Sun | 148/1.5 |

OTHER PUBLICATIONS

Lederhandler et al., "Measurement of Minority Carrier ..." Proc. I.R.E., vol. 43, 1955, pp. 477–484.
Van Lint et al., "Correlation of Displacement ... Neutrons in Silicon" IEEE Trans. on Nuclear Science, vol. NS22, No. 6, 1975, pp. 2663–2668.
Runge, H., "Threshold Voltage Shift ... by Ion Implantation" Electronic Engineering, Jan. 1976, pp. 41–43.
Komaleeva et al. "Influence of Heat Treatment ... in Silicon" Sov. Phys. Semicond, vol. 10, No. 2, Feb. 1976, pp. 191–192.
Rai-Choudhury et al., "Electron Irradiation ... Lifetime Control" IEEE Trans. on Electron Dev., vol. Ed-23, No. 8, Aug. 1976, pp. 814–818.

Primary Examiner—L. Dewayne Rutledge
Assistant Examiner—W. G. Saba
Attorney, Agent, or Firm—Frishauf, Holtz, Goodman & Woodward

[57] ABSTRACT

In a known process for manufacturing a semiconductor element, a single crystal semiconductor body is subjected to at least one high temperature treatment such as diffusion or epitaxy in order to create a pn junction. A metallization is then applied to the upper surface of the semiconductor to constitute an electrode. Thereafter the element is subjected to an annealing process at intermediate temperatures. In accordance with the invention, a semiconductor body is irradiated following the manufacture of the pn junctions and prior to the metallization. The radiation causes lattice displacements which in turn decrease the lifetime of the minority carriers. The above-mentioned annealing process then also serves partially to heal the lattice displacements caused by the radiation.

14 Claims, 4 Drawing Figures

METHOD FOR MANUFACTURING A SEMICONDUCTOR ELEMENT UTILIZING THERMAL NEUTRON IRRADIATION AND ANNEALING

Cross reference to related applications and publications:
1. U.S. Pat. No. 3,067,485
2. S. R. Lederhandler, L. J. Giacoletto Proc. I.R. E. 43,477 (1955)
3. V. A. J. van Lint, G. Gigas, J. Barengoltz IEEE Trans. on Nuclear Science, Vol. Ns-22 Nr. 6 (1975) 2663–68

The present invention relates to methods for manufacturing semiconductor components or elements. More specifically, it relates to a method for manufacturing a monolithic integrated semiconductor circuit. Even more specifically, it relates to methods for manufacturing semiconductor circuits in which steps are taken to shorten the lifetime of the minority carriers.

BACKGROUND AND PRIOR ART

Three groups of semiconductor circuit elements are known for which the lifetime of the minority carriers in the base region must be lowered in a defined fashion in order to achieve a rapid switching characteristic with low switching loss. These groups are:
 (a) fast acting switching diodes;
 (b) thyristors having a low recovery time for intermediate frequency applications (20 KHz); and
 (c) power transistors with rapid switching characteristics, e.g. for operation in logic circuits.

All three building blocks have in common that they can have two switching states: a conductive state in which the high ohmic base region is flooded with minority carriers, and a blocked state in which the base regions are to a great extent free of charge carriers, so that the blocking voltage can be accommodated.

The transition from the conductive state into the blocked state takes the more rapidly, the more rapidly the charge carriers in the base region recombine. If this recombination process takes too long, current still flows in the blocked phase and considerable switching losses occur which can lead to the destruction of the element.

In general, the lifetime of the minority charge carriers in silicon elements having rapid switching characteristics is adjusted by means of an infusion of a heavy metal, for example gold or platinum, at temperatures between 800° and 1300° C. (See, for example, U.S. Pat. No. 3,067,485). The diffusion of gold into the silicon lattice takes place as a coupled mechanism (Frank Turnbull mechanism): first a rapid intersticial diffusion takes place and later a slow change from the intersticial locations to lattice points, the latter being coupled with a slow infusion of double voids from the surface into the volume. Only the gold atoms situated on lattice points can serve as recombination centers for the charge carrier pairs. The number of recombination centers manufactured by means of gold diffusion depends on the following conditions:
 (1) the diffusion temperature which influences the interstitial detachability and the vacancy diffusion constant;
 (2) the diffusion time;
 (3) the dislocation density in the silicon, which affects the detachability of the gold in the substitution lattice points; and
 (4) the cooling conditions.

Following the diffusion of the gold, the silicon must be cooled as rapidly as possible to prevent the gold atoms from being recaptured in the highly doped surface zones.

The disadvantage of this method is that the concentration of the gold atoms at the lattice points does not vary only as a function of the diffusion parameters of temperature and time, but also as a function of the characteristics of the crystal and of the cooling conditions.

For these reasons it is difficult to produce a reproduceable number of recombination centers in semiconductor elements by means of gold diffusion.

THE INVENTION

It is an object of the present invention to furnish a method in which the lifetime of the minority carriers in the semiconductor body is reduced, without the difficulties inherent in the gold diffusion process.

The steps of the present invention include the manufacture of a disc of single crystal silicon and the creation of a pn junction in the silicon by high temperature treatment such as diffusion or epitaxy. After creation of the pn junction the semiconductor element is subjected to radiation which creates lattice dislocations in the crystal. These lattice dislocations shorten the lifetime of the minority carriers. The top surface of the semiconductor is then metallized to allow external connections. An intermediate temperature process, for example at 475° C. for a duration of about fifteen (15) minutes, following metallization improves the connection of the metallization with the surface of the semiconductor and simultaneously causes partial healing of the lattice dislocations caused by the radiation.

DRAWINGS ILLUSTRATING A PREFERRED EMBODIMENT OF THE INVENTION

Figure 1:
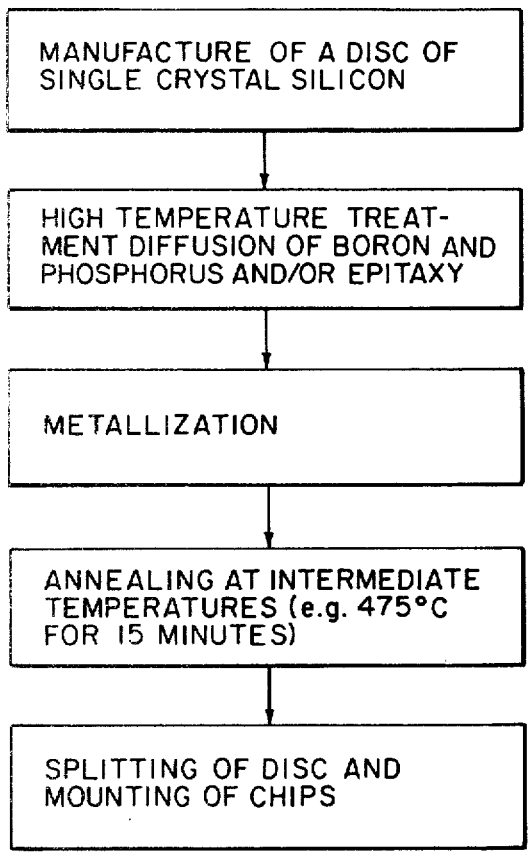
FIG. 1 is a flow chart of a known method for the manufacture of semiconductor elements in which no measures are taken shortening the lifetime of the minority carriers.

In FIG. 1 the steps are shown by which a slowly switching silicon semiconductor element is manufactured in the known way. These steps are part of the state of the art and do not need to be explained in detail. What is important is that the steps according to FIG. 1 can only result in the manufacture of a slowly switching element. For example, in the case of transistors, only slowly switching transistors having a median lifetime of 15 microseconds for the minority carriers at the collector can be manufactured in this fashion.

Figure 2:
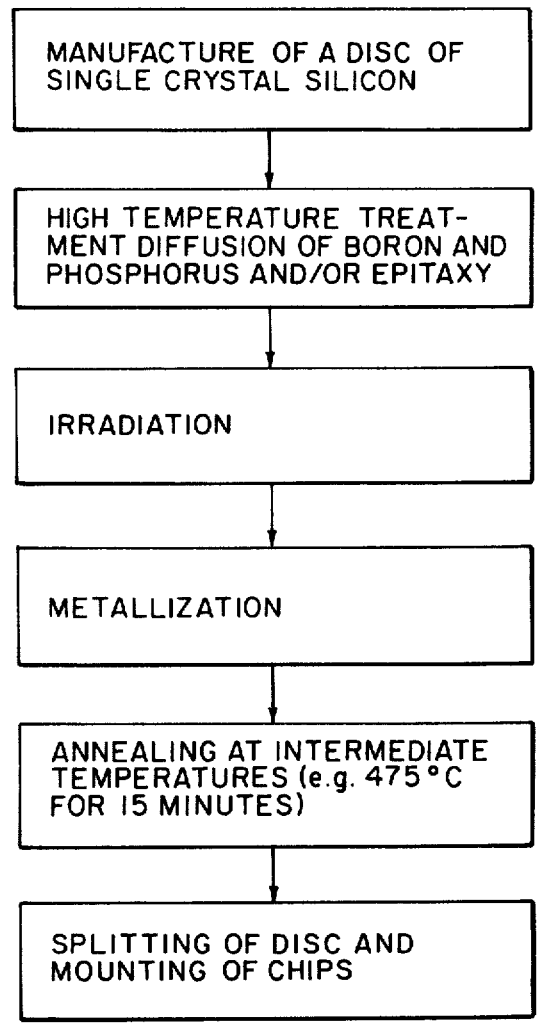
FIG. 2 is a flow chart of a first preferred embodiment of the present invention.

FIG. 2 shows a first preferred embodiment of the method according to the present invention. The additional step of irradiating the silicon disc prior to metallization is added to the steps shown in FIG. 1. The nuclear reactions which take place as a result of this radiation with the three silicon isotopes and the doping substances of phosphorus and boron cause radiation damage in the silicon lattice. The damaged locations serve as recombination centers for the charge-carriers pairs. The annealing in the intermediate temperature range, preferably at 475° C., which follows the metallization process causes the radiation damage to be removed and thereby creates stable electrical parameters (lifetime of charge-carriers, amplification) in the semiconductor element. At the same time, the lifetime of the minority carriers is reduced by the desired amount. The advantages relative to the gold diffusion process lie in the higher reliability and in the improved reproduceability of the resulting element.

It is advantageous to use radiation sources whose interaction with the silicon is relatively small so that a homogeneous distribution of radiation density and therefore of radiation damage in the lattice results. These requirements are met by neutrons because of the lack of Coulomb interaction with the material. In particular, thermal neutrons with energies of less than 0.5 eV should be selected because they can be generated in large volumes (5,000 cm$^3$) with very even radiation density. Further, thermal neutrons create mostly (n, $\gamma$) processes which do not create very long-lived radiating reaction products in the silicon or the doping substances.

Both neutron scattering processes and nuclear transmutations with the lattice atoms arise during irradiation of the silicon. The scattering processes can be neglected as far as the generation of recombination centers is concerned, since the lattice dislocations which arise therefrom can be healed by temperatures in the 100°–200° C. range. However the energy liberated in a nuclear reaction can result in considerable lattice dislocations. The simplest lattice dislocation—at Frenkel-defect—exists, when a vacancy or void is created at the location of the reacting atom while the atom has moved to an intersticial location. A further possibility exists that the reacting atom collides with a neighboring atom and generates a plurality of empty locations (a thinned-out zone) which is surrounded by a plurality of intersticial atoms. Furthermore, the reacting atom can be moved 10–20 interatomic distances from its original position by the reaction energy, there create a thinned-out zone due to collision, change direction, and at several interatomic distances therefrom again create a thinned-out zone. Thus a nuclear reaction can create a plurality of separate dislocations which are spacially removed from one another.

These dislocations affect the electrical characteristics of the element in that an increase in the resistivity of the silicon results which may be explained by a reduced mobility of the charge-carriers. In addition, the lifetime of the charge-carriers is decreased by recombination at the lattice dislocations. The active amplification of the transistor is therefore decreased.

The lattice dislocations can be healed almost completely by thermal treatment if temperatures of 1300° C. and application times of 1 to 2 hours are used. If however the temperature is substantially lower (400°–500° C.), then an incomplete healing process will result even for very long annealing times. This is because a healing activation energy can be assigned to each lattice dislocation, this energy depending greatly on the distance between the void and the intersticial atoms in the case of Frenkel pairs. In general Frenkel defects with distances of only a few silicon atoms may be healed at temperatures up to 400° C., while thinned-out zones require much higher healing energies and therefore also considerably higher temperatures.

Thus a large number of lattice dislocations may be healed in an annealing process at median temperatures between 400° and 500° C. These temperatures however do not suffice for healing of lattice dislocations with higher activation energies. Thus the possibility exists that radiation dislocations may be created in the silicon lattice of the semiconductor element after such high temperature processes as diffusion or epitaxy by radiation with thermal neutrons. If after such radiation only temperature processes at temperatures of between 400° and 500° C. are applied, then for a sufficient annealing time the resulting element will have stable electrical characteristics even for junction temperatures of 180° C.

For manufacturing a 1,000 volt npn power transistor the method of the invention will be carried out as follows:

silicon with a phosphorus doping of $10^{14}$/cm$^3$ can be used as the starting material for the manufacture of a npn power transistor. A switching transistor which theoretically has the structure n+pnn+ is constructed by means of a triple diffusion process or a combination of epitaxy and diffusion. Reading from left to right in the resulting structure n+ is the emitter which is doped with phosphorus, p is the base which is doped with boron, n is the high resistance collector and n+ the collector connection diffusion layer which again is doped with phosphorus. The diffusion or epitaxy temperatures required for the manufacture of these zones are in the region of 1100° and 1250° C.

A semiconductor disc on which a plurality of transistor chips are arranged is irradiated with thermal neutrons of a flow of $2 \cdot 10^{11}$ neutrons/cm$^2$·s for 15 hours. Table 1 lists the nuclear reactions which will result in a nonmetallized transistor structure of this type. The reaction with the oxygen isotope which arises in the SiO$_2$ layers can be disregarded because this reaction is not expected to cause radiation damage in the lattice and because only a small amount of fluorine 19 of $10^6$–$10^7$/cm$^2$ in the SiO$_2$ layer is to be expected because of the small effective cross section and the low $18_O$ isotope frequency under the above radiation conditions.

The effective cross sections given in the last column are of course only average values and depend upon the shape of the neutron energy spectrum (dependency of the (n, $\gamma$) and (n, $\alpha$) effective cross sections on the reciprocal velocity for small neutron energies). If at first only nuclear processes involving the silicon isotopes are taken into consideration, the number of these processes [Z] (cm$^{-3}$) may be determined in accordance with equations 1 and 2 from the effective cross section of the individuals reaction $\sigma$ and the neutron flow $\Phi$ (n/cm$^2$). For a thermal neutron flow of $1.08 \cdot 10^{16}$ n/cm$^2$, $4.9 \cdot 10^{13}$/cm$^3$ recombination centers will be formed if it is assumed that only one recombination center is generated by each nuclear reaction. This corresponds approximately to the number of recombination centers which are generated by means of gold diffusion at 825° C. in the silicon lattice for a diffusion time of one hour.

In addition to the radiation damage which is uniformly distributed throughout the silicon volume, an increase in the concentration of radiation damage in the n+ and p+ zones of the transistor due to neutron reaction with boron and phosphorus must be expected.

If it is assumed that the planar transistor has a surface density of $1 \cdot 10^{18}$/cm$^2$ phosphorus atoms in the n+ layer and a density of $5 \cdot 10^{15}$/cm$^2$ boron atoms in the p+ layer, then, again for $\Phi = 1.08 \cdot 10^{16}$ n/cm$^2$, the results of equations 3 and 4 are obtained for the surface density of nuclear processes which occur additionally in these zones. The concentration of sulphur generated in the n+ layers is not critical, since it also acts as n-doping. The boron doping causes an additional lithium and carbon contamination in the silicon lattice. For a disc thickness of 200μ and assuming a uniform distribution of lithium throughout the whole crystal, a lithium concentration of $2 \cdot 10^{12}$/cm$^3$ results, which does not affect the characteristics of the element.

The carbon induced additionally by the (n, γ) reaction in the p+ zone is, at $4 \cdot 10^4$/cm$^2$, too low to be detected.

The $\beta^-$ activity created by phosphorus 32 which has a half-life of 14 days can result in an upper limit to the allowable radiation time, since discs with $\beta^-$ activity present a preparation problem in semiconductor technology. On the other hand silicon discs with transistor chips which had been irradiated for 15 hours show an activity of 0.02 μC two weeks after the end of irradiation and are therefore substantially under the limit of 10 μC.

After irradiation, the discs are metallized and subjected to the annealing step (heating at 475° C. for 15 minutes in a forming gas atmosphere) required for affixing the metal layer to the disc. After this annealing step and all following temperature processes at temperatures less than 400° C., the healing processes which take place at low temperatures are substantially completed. Thereafter the discs are scratched, broken, mounted on bases and soldered in accordance with the standard procedure.

In this fashion transistors with a stable gain and switching time can be manufactured which do not exhibit drift characteristics even at junction temperatures of 180° C.

Figure 3:
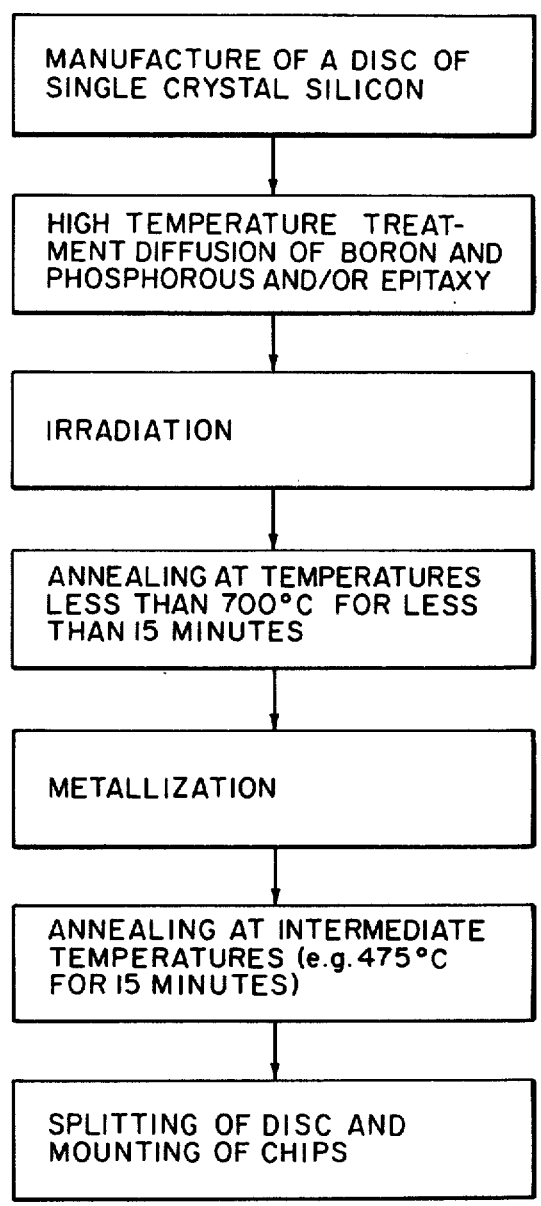
FIG. 3 is a flow chart of a second preferred embodiment of the present invention.

In the embodiment according to FIG. 3, an additional temperature process is included after the irradiation. The additional temperature step may be required for the healing of radiation damage. It takes place at a temperature which is less than 700° C. and higher than the temperature during the annealing process which takes place following the metallization and which is required in any case for diffusing the metallization into the surface of the disc.

Figure 4:
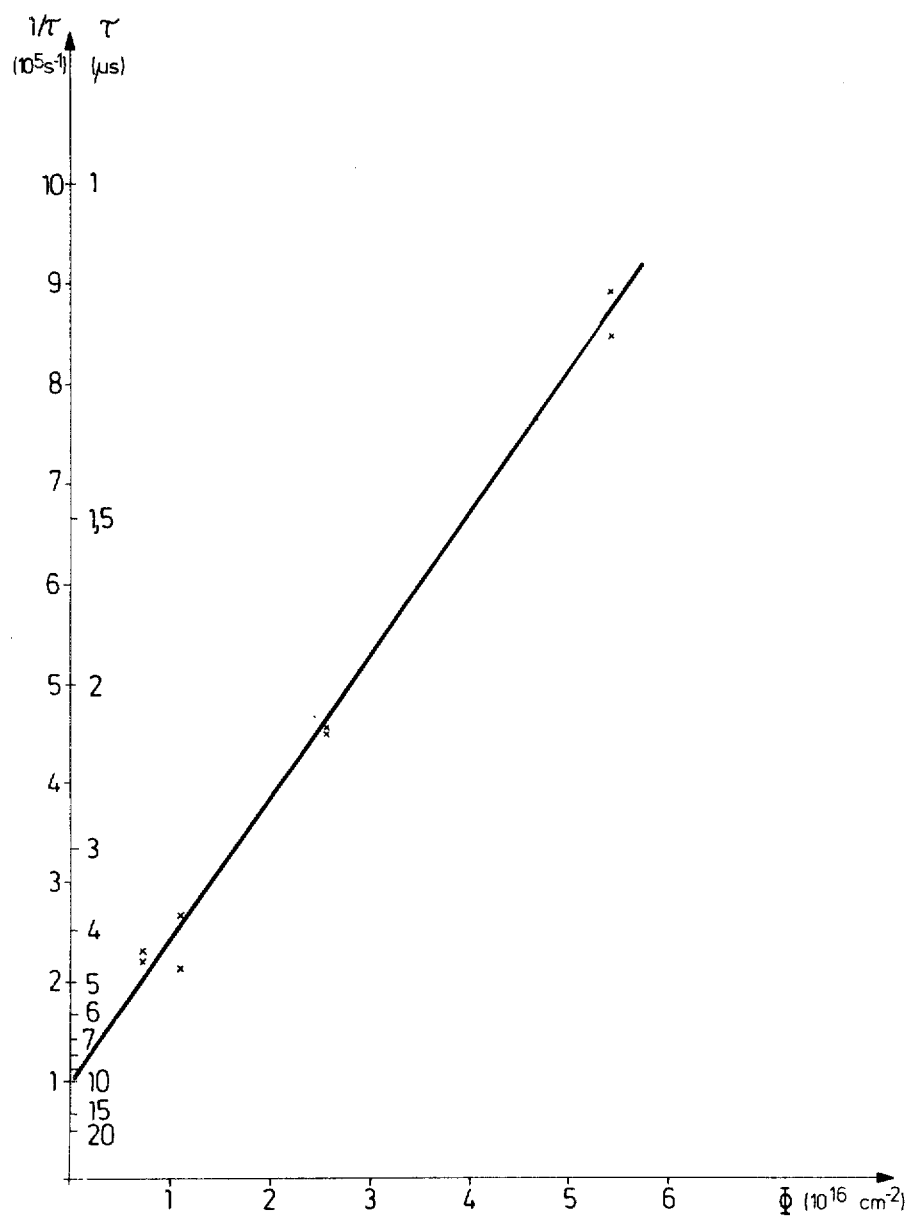
FIG. 4 is a diagram illustrating the variation of lifetime of the minority carriers and its reciprocal as a function of neutron flow when the method of the present invention is used to manufacture a rapidly switching 1,000 volt power transistor.

In FIG. 4 the results of the lifetime decrease for different values of neutron flow in power transistors is plotted as an example. With the aid of this plot, the required neutron flow Φ for different applications for creating the required lifetime decrease may be chosen.

The lifetime of the minority carriers at the base-collector diode of the transistor was determined according to the "post injection decay" method of Lederhandler and Giacoletto. In this method, the diode which is driven at 10 mA in the conduction direction is blocked momentarily and the decrease of diode voltage is taken as a measurement for the lifetime. The lifetimes before and after irradiation are denoted by $\tau_o$ and $\tau \cdot K_\tau$ is denoted as "radiation damage" factor in the literature (article by van Lint et al). A result of this measurement is approximately $1.4 \cdot 10^{-11}$ cm$^2$s$^{-1}$.

Various changes and modifications may be made within the scope of the inventive concept.

TABLE 1

| Original Nucleus | Isotope Concentration | Core Reaction | Effective Cross-Section ($10^{-24}$cm$^2$) |
|---|---|---|---|
| $^{10}B$ | 19.6% | $^{10}B(n,\gamma)\,^{11}B$ | 0.50 |
|  |  | $^{10}B(n,\alpha)\,^{7}Li$ | 3830 |
| $^{11}B$ | 80.4% | $^{11}B(n,\gamma)\,^{12}B \xrightarrow[20ms]{\beta^-} {}^{12}C$ | $5 \cdot 10^{-3}$ |
| $^{18}O$ | 0.203% | $^{18}O(n,\gamma)\,^{19}O \xrightarrow[27\,s]{\beta^-} {}^{19}F$ | $2 \cdot 10^{-4}$ |
| $^{28}Si$ | 92.28% | $^{28}Si(n,\gamma)\,^{29}Si$ | 0.08 |
| $^{29}Si$ | 4.67% | $^{29}Si(n,\gamma)\,^{30}Si$ | 0.28 |
| $^{30}Si$ | 3.05% |  | 0.11 |
|  |  | $^{30}Si(n,\gamma)\,^{31}Si \xrightarrow[2,62h]{\beta^-} {}^{31}P$ |  |
| $^{31}P$ | 100% | $^{31}P(n,\gamma)\,^{32}P \xrightarrow[14,3d]{\beta^-} {}^{32}S$ | 0.20 |

Equations
1 $[Z] = \{[28_{Si}] \cdot \sigma_{28Si} + [29_{Si}] \cdot \sigma_{29Si} + [30_{Si}] \cdot \sigma_{30Si}\} \cdot \Phi$;
2 $[Z] = 4.507 \cdot 10^{-3} \cdot \Phi$;
3 $[Z_n +]$ (cm$^{-2}$) $= 10^{18} \cdot \sigma_{31P} \cdot \Phi = 2.16 \cdot 10^{9}$/cm$^2$;
4 $[Z_p +]$ (cm$^{-2}$) $= 5.10^{15} \cdot (0.196 \cdot \sigma_{10B} + 0.804 \cdot \sigma_{11B}) \cdot \Phi$
$= 4.05 \cdot 10^{10}$/cm$^2$.

I claim:
1. In a method for manufacturing a semiconductor element from a single crystal semiconductor body having a crystal lattice and at least one surface, said method comprising the steps of
 subjecting said single crystal semiconductor body to at least one high temperature process for creating a pn junction;
 then irradiating said semiconductor body with thermal neutrons at a rate of $2 \cdot 10^{11}$ neutrons/cm$^2$·s for about 15 hours to create homogeneously distributed recombination centers;
 then applying a metallization to said semiconductor body to constitute an electrode;
 and then subjecting said semiconductor body with said metallization to an annealing process at an intermediate temperature between 180° and 600° C. for joining said metallization to said surface of said semiconductor body;
 said step of subjecting said semiconductor body to said annealing process also partially healing said lattice dislocations.
2. A method as set forth in claim 1, wherein high temperature process is a diffusion process.
3. A method as set forth in claim 1, wherein said high temperature process is an epitaxy process.
4. A method as set forth in claim 1, wherein said intermediate temperature is 475° C.
5. A method as set forth in claim 1, further comprising;
 the step of subjecting said semiconductor body to a further annealing process following said step of irradiating said semiconductor body but preceding said step of applying a metallization to said surface, said further annealing process taking place at a temperature exceeding said intermediate temperature but less than 700° C.
6. A method as set forth in claim 1, wherein said step of irradiating said semiconductor body comprises the step of irradiating said semiconductor body for a radiation time and at a radiation rate for creating a preselected number of lattice dislocations.
7. A method as set forth in claim 1, wherein said semiconductor elements are switching diodes having n+pp+ layers.

8. A method as set forth in claim 1, wherein said semiconductor elements are switching diodes having p+nn+ layers.

9. A method as set forth in claim 1, wherein said semiconductor elements are transistors having n+pnn+ layers.

10. A method as set forth in claim 1, wherein said semiconductor elements are transistors having p+np+ layers.

11. A method as set forth in claim 1, wherein said semiconductor elements are thyristors having n+pnp+ layers.

12. A method as set forth in claim 1, wherein said semiconductor elements are bidirectional thyristors having n+pnpn+ layers.

13. In a method for manufacturing a semiconductor element from a single crystal semiconductor body having a crystal lattice and at least one surface, said method comprising the steps of subjecting said single crystal semiconductor body to at least one high temperature process for creating a pn junction;

then irradiating said semiconductor body with thermal neutrons to create homogeneously distributed recombination centers;

then subjecting said semiconductor body to an annealing process below 700° C. but above an intermediate temperature of between 180° C. and 600° C.;

then applying a metallization to said semiconductor body to constitute an electrode;

and then subjecting said semiconductor body, with said metallization, to an additional annealing process at said intermediate temperature, for joining said metallization to said surface of said semiconductor body.

14. Method according to claim 13, wherein said step of irradiating said semiconductor body comprises the step of irradiating said semiconductor body for a radiation time and at a radiation rate for creating a preselected number of lattice dislocations.

* * * * *